US009818706B2

(12) United States Patent
Kertesz

(10) Patent No.: US 9,818,706 B2
(45) Date of Patent: Nov. 14, 2017

(54) MOISTURE-RESISTANT ELECTRONIC COMPONENT, NOTABLY MICROWAVE, AND METHOD FOR PACKAGING SUCH A COMPONENT

(71) Applicant: Thales, Courbevoie (FR)

(72) Inventor: Philippe Kertesz, Rueil Malmaison (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 15/141,442

(22) Filed: Apr. 28, 2016

(65) Prior Publication Data

US 2016/0322315 A1 Nov. 3, 2016

(30) Foreign Application Priority Data

Apr. 30, 2015 (FR) ..................... 15 00912

(51) Int. Cl.
*H01L 21/00* (2006.01)
*H01L 23/66* (2006.01)
(Continued)

(52) U.S. Cl.
CPC .......... *H01L 23/66* (2013.01); *H01L 21/4853* (2013.01); *H01L 21/4857* (2013.01); *H01L 21/54* (2013.01); *H01L 21/56* (2013.01); *H01L 21/565* (2013.01); *H01L 23/24* (2013.01); *H01L 23/293* (2013.01); *H01L 23/3128* (2013.01); *H01L 23/3675* (2013.01); *H01L 23/5383* (2013.01); *H01L 23/5384* (2013.01); *H01L 23/5386* (2013.01); *H01L 23/5389* (2013.01); *H01L 23/552* (2013.01); *H01L 23/60* (2013.01); *H01L 24/17* (2013.01); *H01L 24/19* (2013.01); *H01L 24/20* (2013.01); *H01L 24/50* (2013.01); *H01L 24/83* (2013.01); *H01L 23/36* (2013.01); *H01L 23/4985* (2013.01); *H01L 23/49816* (2013.01); *H01L 23/564* (2013.01); *H01L 24/29* (2013.01); *H01L 24/32* (2013.01); *H01L 24/73* (2013.01); *H01L 2223/6683* (2013.01); *H01L 2224/12105* (2013.01); *H01L 2224/16225* (2013.01); *H01L 2224/29111* (2013.01);
(Continued)

(58) Field of Classification Search
CPC ... H01L 2914/1423; H01L 2924/15311; H01L 21/4857; H01L 21/54; H01L 2223/6683; H01L 21/56; H01L 23/60
USPC .......................... 257/728, 787; 438/127, 125
See application file for complete search history.

(56) References Cited

U.S. PATENT DOCUMENTS 5,796,170 A 8/1998 Marcantonio
7,482,678 B2 1/2009 Kertesz et al.
(Continued)

FOREIGN PATENT DOCUMENTS

EP 0 872 888 A2 10/1998
FR 2 849 346 A1 12/2002
(Continued)

*Primary Examiner* — S. V. Clark
(74) *Attorney, Agent, or Firm* — Baker & Hostetler LLP

(57) ABSTRACT

A component comprises at least one support on which is fixed at least one electronic circuit, for example a circuit of MMIC type, one or more layers of organic materials stacked on the support according to a technique of printed circuit type and forming a pre-existing cavity containing the electronic circuit, the cavity being filled with a material of low permeability to water vapor such as LCP.

16 Claims, 2 Drawing Sheets

(51) Int. Cl.
　　　*H01L 23/538*　　(2006.01)
　　　*H01L 23/552*　　(2006.01)
　　　*H01L 23/00*　　(2006.01)
　　　*H01L 21/48*　　(2006.01)
　　　*H01L 21/56*　　(2006.01)
　　　*H01L 23/29*　　(2006.01)
　　　*H01L 23/31*　　(2006.01)
　　　*H01L 23/367*　　(2006.01)
　　　*H01L 23/60*　　(2006.01)
　　　*H01L 23/24*　　(2006.01)
　　　*H01L 21/54*　　(2006.01)
　　　*H05K 1/18*　　(2006.01)
　　　*H01L 23/36*　　(2006.01)
　　　*H01L 23/498*　　(2006.01)

(52) U.S. Cl.
　　　CPC ............... *H01L 2224/29144* (2013.01); *H01L 2224/32245* (2013.01); *H01L 2224/73253* (2013.01); *H01L 2224/73267* (2013.01); *H01L 2224/83801* (2013.01); *H01L 2924/014* (2013.01); *H01L 2924/01029* (2013.01); *H01L 2924/1423* (2013.01); *H01L 2924/15311* (2013.01); *H01L 2924/302* (2013.01); *H01L 2924/3025* (2013.01); *H05K 1/186* (2013.01)

(56) References Cited

U.S. PATENT DOCUMENTS

| | | | | |
|---|---|---|---|---|
| 8,120,153 | B1* | 2/2012 | Shen | H01L 21/565 |
| | | | | 257/677 |
| 8,143,530 | B1* | 3/2012 | Das | B32B 37/02 |
| | | | | 174/250 |
| 8,502,376 | B2* | 8/2013 | Camacho | H01L 21/6835 |
| | | | | 257/737 |
| 2006/0042078 | A1 | 3/2006 | Takeuchi et al. | |
| 2008/0017409 | A1 | 1/2008 | Takeuchi et al. | |
| 2013/0161782 | A1* | 6/2013 | Rajendran | H01L 23/13 |
| | | | | 257/506 |
| 2014/0217566 | A1* | 8/2014 | Goida | H01L 23/04 |
| | | | | 257/676 |
| 2015/0237712 | A1 | 8/2015 | Tago | |
| 2015/0294754 | A1 | 10/2015 | Ohata | |
| 2016/0050793 | A1* | 2/2016 | Laidig | H01L 23/047 |
| | | | | 361/709 |

FOREIGN PATENT DOCUMENTS

| | | |
|---|---|---|
| FR | 2 877 537 A1 | 10/2004 |
| WO | 2014083908 A1 | 6/2014 |
| WO | 2014188830 A1 | 11/2014 |

* cited by examiner

MOISTURE-RESISTANT ELECTRONIC COMPONENT, NOTABLY MICROWAVE, AND METHOD FOR PACKAGING SUCH A COMPONENT

CROSS-REFERENCE TO RELATED APPLICATIONS

This application claims priority to foreign French patent application No. FR 1500912, filed on Apr. 30, 2015, the disclosures of which are incorporated by reference in their entirety.

FIELD OF THE INVENTION

The present invention relates to a moisture-resistant microwave component. It relates also to a method for packaging a circuit, notably microwave.

BACKGROUND

The invention falls notably in the field of microwave microelectronic packaging, in particular for producing microwave packages comprising an integrated and moisture-resistant shielding. These packages are for example used in complex microwave equipment items such as airborne electronic scanning radars. More generally, the field of application is that of the narrow band or wide band microwave equipment items, the packages being able to be used in all high-frequency applications, even those with high signal integrity specifications.

The only microwave packaging technologies that are moisture resistant rely on the use of inorganic materials or on the encapsulation of the components using injected organic resins. The inorganic solutions notably use metallic hermetic packages with glass beads for the inputs/outputs or ceramics.

The solutions that use inorganic materials present a number of drawbacks. These results are notably:
- packages that are expensive and heavy, because of the materials used, metal or ceramic;
- bulky solutions, notably using packages with internal cavities, very often with peripheral interconnections;
- solutions for which the reliability of mounting, in the equipment item concerned, is generally problematic, because of differences in expansion coefficient with the printed circuits on which they are assembled.

In the case of injected organic packagings, the end result is objects which are intrinsically unshielded electrically and which cannot therefore be used as such in complex equipment items where crosstalk is a critical parameter. The package usually encountered is the so-called QFN (Quad Flat No-Lead) package which has generally peripheral inputs and outputs.

There is a need for compact packages that meet the following constraints:
- protecting the encapsulated functions from moisture, notably to take account of all the MMIC (Microwave Monolithic Integrated Circuit) technologies;
- obtain a good mounting reliability;
- maintain the possibility of changing the packages on the board;
- being suitable for dissipating heat;
- having a capacity to be able to do 3D, that is to say, according to the architectures, even with ultra-compact packages, stacking microwave functions according to the integration density of the chips used.

The microwave applications require the use of III-V semiconductors with high charge mobility. These components operate in analogue mode and are therefore very sensitive to the quality of the interconnections that they use and to the interferences that they can encounter. In addition, since they operate at significant voltages and currents, the electronic components (transistors, capacitors, resistors, etc.) can be subject to corrosion phenomena when the latter are operating, for example electrochemical corrosions through Nernst potential difference.

To avoid any problem of reliability, the manufacturers have first of all developed hermetic packages that use inorganic materials (metals or ceramics as indicated previously) which are heavy and bulky. In order to reduce the weight, the volume and the cost of manufacturing of the microwave packagings, plastic packages have begun to be developed with a loss of electromagnetic performance levels that is significant but acceptable for the narrow band applications such as mobile telephony.

The field of electronic packaging has been the subject of numerous developments. The package of BGA (Ball Grid Array) type with surface interconnections was developed in response to the QFP (Quad Flat Pack) technology with peripheral interconnections in order to increase the interconnection density. This type of BGA package has experienced high growth for silicon semiconductor-based digital applications.

In the field of microwave organic packagings, many solutions have also been developed. Solutions that can be cited include the CSP (Chip Scale Package) technology for narrow band applications with an operational frequency below 2.17 GHz. Plastic packages capable of managing heat dissipations of the order of 60 W to 100 W have also been developed for applications ranging up to 2.17 GHz. There are plastic packages for high-frequency applications, up to 35 GHz, in narrow band of QFN type. Plastic packages of QFN or TSOP (Thin Small Outline Package) type operate up to 12 GHz. A package with cavity using a thermoplastic material called LCP (Liquid Crystal Polymer) was developed at the end of the last decade for high-frequency applications. During the same period, the concept of packaging for microwave applications in LTCC (Low Temperature Cofired Ceramic) technology and in LCP organic materials, has emerged. The package of QFP (Quad Flat Pack) type, with cavity, has allowed encapsulation with satisfactory performance levels, of a wide band function.

Moreover, patent applications FR 2 849 346 and FR 2 877 537 describe a BGA organic packaging technology with cavity.

As has been indicated previously, the only moisture-resistant microwave packaging technologies that are compatible with all the MMICs rely on the use of inorganic materials (metal packages with glass beads for the inputs and outputs or ceramic packages), or on the encapsulation of the components using injected organic resins. The solutions based on inorganic materials lead to the use of expensive and heavy packages, and are bulky, particularly because of the internal cavities and the peripheral interconnections. The solutions based on organic materials have the major drawback of not being electrically shielded, and cannot therefore be used in complex equipment items where cross talk is a critical parameter without additional partitioning.

SUMMARY OF THE INVENTION

One aim of the invention is notably to mitigate the abovementioned drawbacks, by notably making it possible to produce electronic component packages that have little bulk, that are cost effective and suitable for shielding. To this end, the subject of the invention is an electronic component, comprising at least one support on which is fixed at least one electronic circuit, one or more layers of organic materials stacked on said support according to a technique of printed circuit type and forming a pre-existing cavity in which said electronic circuit is enclosed, said cavity being filled with a material of low permeability to water vapour, said material of low permeability to water vapour being, for example, of LCP type.

In one possible embodiment, the support being metallic and the top organic layer of the stack being covered with a metallic layer, a network of metallic elements each linked to said support and to said metallic layer is arranged at the periphery of said component so as to form a Faraday cage including said electronic circuit, said metallic elements being, for example, metallized holes.

Said component comprises, for example, a flexible layer of interconnections of TAB type, stacked with said layers of organic materials, said layer of interconnections linking the connection points of said electronic circuit to interconnection points.

Said component being of BGA type, an array of balls is for example arranged on said metallic layer. It comprises, for example, at least one layer of LCP thermoplastic material. The support forms, for example, a heat sink. It comprises, for example, at least one rigid layer.

Said electronic circuit is, for example, a microwave circuit of MMIC type.

Another subject of the invention is a method for packaging at least one electronic circuit, said method comprising at least:
 a first phase in which said electronic circuit is fixed onto a support and a number of layers of organic materials, interleaved with layers of LCP thermoplastic material, are stacked on said support to form a cavity in which said electronic circuit is enclosed, said cavity being filled by creep of an LCP thermoplastic material;
 a second phase in which said layers are pressed onto said support at the melting point of the LCP material to bond all the layers together, a function of the stacked layers being to participate in the bonding of all the layers.

An interconnection layer of TAB type is for example stacked with said layers, said interconnection layer being connected beforehand to the electronic circuit.

The top layer covering the cavity is for example covered with a metallic layer. Said support being metallic, in a third phase, an array of metallized holes is for example produced on the periphery of the stacking of said layers, said holes electrically linking said support and said metallic layer so as to form a Faraday cage.

In the third phase, an array of balls is for example fixed onto said conductive layer, balls being linked electrically to said electronic circuit.

BRIEF DESCRIPTION OF THE DRAWINGS

Other features and advantages of the invention will become apparent from the following description, given in light of the attached drawings which represent.

DETAILED DESCRIPTION

Figure 1:
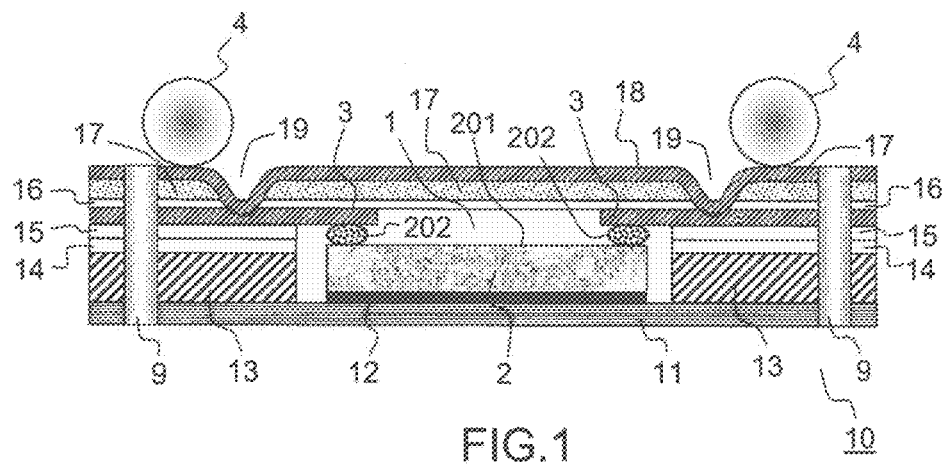
FIG. 1, an example of production of a microwave component according to the invention.

FIG. 1 illustrates, by a cross-sectional view, an example of production of a microwave component 10 according to the invention. The principle of the invention relies on the use of a thermoplastic material 1, for example of the LCP (Liquid Crystal Polymer) type, a material that is moisture-tight, with low permeability to water vapour, filling a pre-existing cavity in which is placed at least one microwave circuit 2. Consequently, by way of example, a microwave component 10 is described that comprises a single microwave circuit 2. A component according to the invention can of course comprise a number of electronic chips and passive components.

The package of a component according to the invention does not therefore have any cavity. The microwave circuit 2, for example a chip of MMIC type that is thus encapsulated is covered with a moisture-tight material, advantageously of LCP material, a material that is intrinsically hydrophobic. The deformation of this material 1 makes it possible to fill the cavity and makes it possible to obtain stackings that are uniform and resistant to the ingress of water. Likewise at its melting point, the LCP becomes quasi-liquid and no longer exerts any mechanical stress. This property makes it possible to conserve the integrity of fragile microwave structures such as the "air bridges" that are found on many MMICs.

Advantageously, the invention uses, for example within the package, a layer of interconnections 3 exhibiting a certain flexibility, of TAB type, to interconnect the microwave circuit 2 with the external connections 4, of BGA type. In a TAB (Tape Automated Bonding) type connection mode, the interconnection links are conductive tracks placed on a dielectric film 15, for example of polyimide. This type of connection makes it possible to control the electrical quality of the connections produced and thus operation at high frequency and within a wide band.

The microwave component 10 of FIG. 1 can comprise a metal plate 11 forming a heat sink. The microwave circuit 2 is fixed onto this plate 11 by bonding or by brazing 12, the bond or the braze also forming a thermal coupling.

The microwave circuit 2 is placed in a pre-existing cavity delimited laterally by a first layer 13, of rigid thermosetting material. This first layer 13 is for example topped by one or more layers 14, 15 of LCP thermoplastic material. The thermoplastic layers 14, 15 support the layer 3 of TAB type, more specifically the dielectric films equipped with conductive tracks. This layer 3 makes it possible to interconnect the microwave circuit 2 with other possible circuits arranged inside the package or with input and output connections, notably brazing balls 4, the package being of BGA type.

These layers of organic material 13, 14, 15 are covered with a top layer 17, also of organic material.

The cavity delimited by these layers 13, 14, 15, 17 encloses the microwave circuit. It is filled by creep of the thermoplastic material LCP 1 so as to encapsulate the microwave circuit as described previously.

The film 3 of interconnection of TAB type is for example covered with a layer 16 of LCP thermoplastic material.

The whole is covered with an outer layer consisting of the top layer 17, for example of LCP thermoplastic material or of thermosetting material, covered with a metallic layer 18, of copper for example. The thermoplastic layers 16, 17 topping the interconnection 3 of TAB type are pierced at a number of points, for example by laser beam, so as to accommodate depressions 19 facing perforations produced on the interconnection 3.

Figure 2:
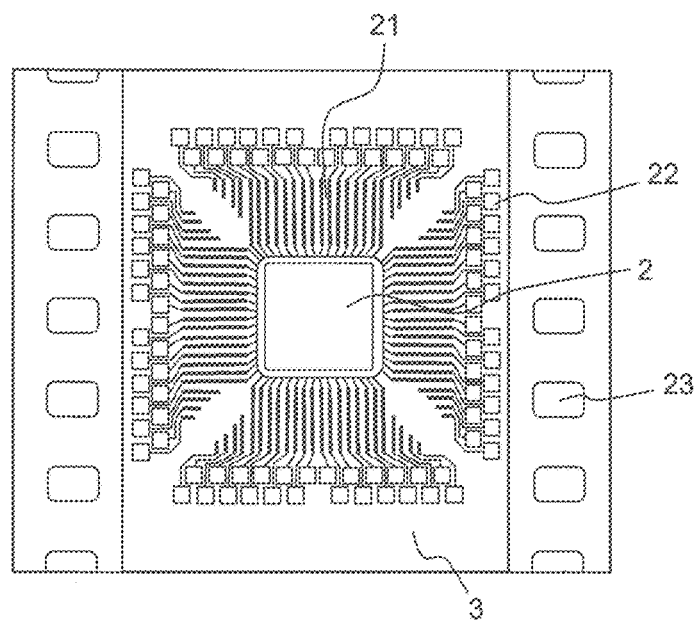
FIG. 2, an example of electrical connection used in a component according to the invention.

FIG. 2 illustrates a connection layer of TAB type as used in the component of FIG. 1. This connection layer consists of a plastic film 3 on which are placed conductive tracks 21 linking connection points 202 of the microwave circuit 2, as shown in FIG. 1, to interconnection points 22 situated on the plastic film. These interconnection points 22 are themselves linked by a network of tracks or of vias to other active or passive circuits, or even to the inputs and outputs of the component.

The film 3 also comprises perforations 23 in which the depressions 19 are positioned. Advantageously, the connection layer 3 has a curvature making it possible to compensate the dual mechanical stress originating on the one hand from the depression 19 and on the other hand from the rear face 201 of the chip 2 forming the microwave circuit.

Figure 3:
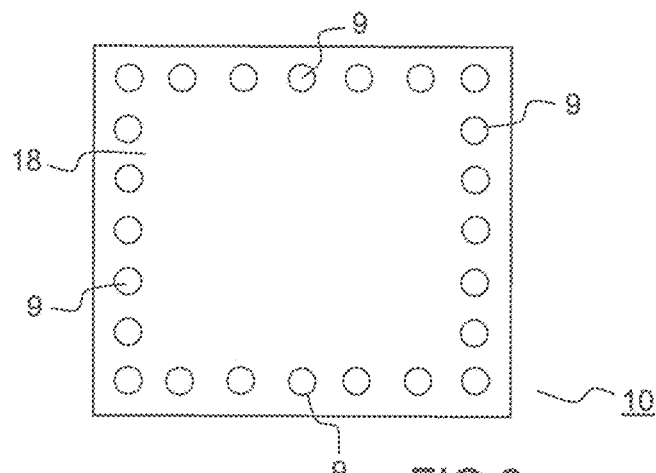
FIG. 3, an example of electrical shielding of a component according to the invention.

To return to FIG. 1, metallized holes 9 pass through the periphery of the component to electrically link the conductive plane 11 forming the drain with the conductive plane 18 supporting the outer connection balls 4. These holes are arranged over all the periphery of the component, for example regularly, to form a Faraday cage delimited by the conductive planes 11, 18 and by the network of metallized holes 9. FIG. 3 illustrates, by a plan view of the component 10, an exemplary arrangement of these holes 9 at the periphery. The holes could be replaced by metal bump contacts. A packaging is thus obtained that is intrinsically shielded by the production of an internal Faraday cage coupled in a quasi-coaxial interconnection mode.

Figure 4:
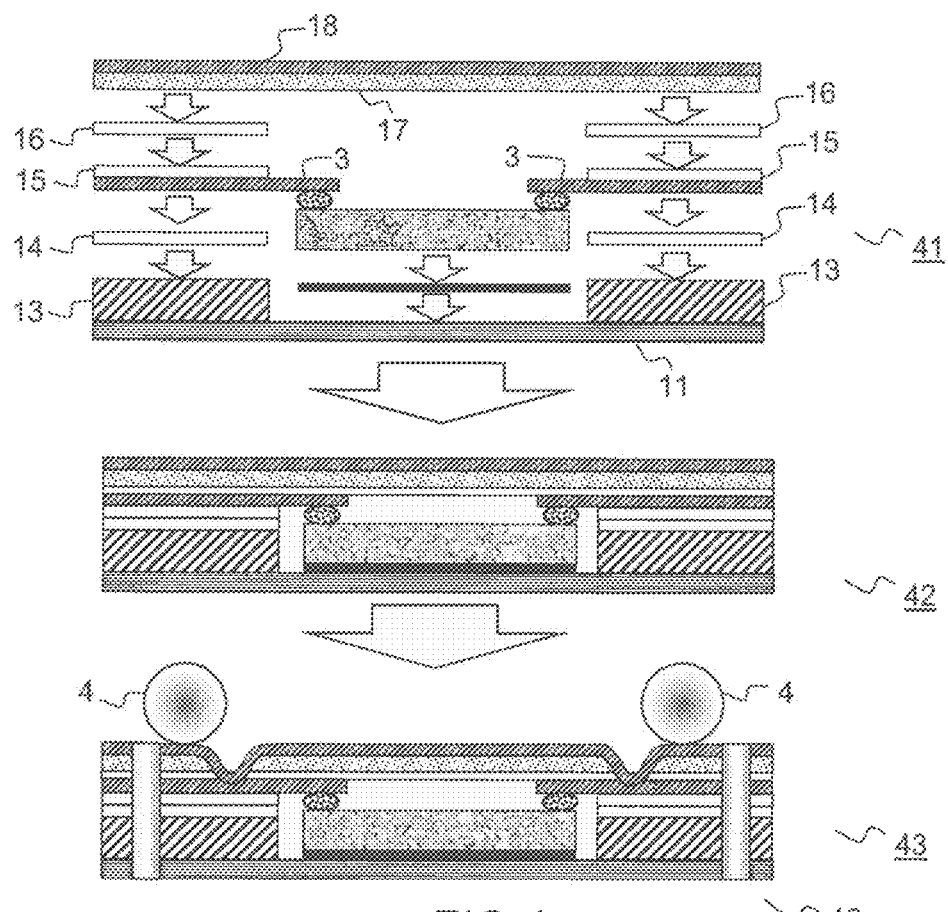
FIG. 4, an illustration of the possible steps in producing a device according to the invention.

FIG. 4 illustrates an example of packaging method according to the invention making it possible notably to obtain a microwave component as described previously.

The packaging principle of a component according to the invention relies on the use of layers of LCP thermoplastic material. By its thermoplastic nature, the LCP material is deformed, creeps, upon its application towards 280° C., to shape and fill the pre-existing cavity.

In a first production phase 41, the various constituent parts of the component 10 are assembled. The rigid layer 13 is fixed onto the support-forming metallic plane 11. The metallic plane can also be formed by a layer of copper-plated thermosetting material. The chip 2 is bonded by its rear face onto this plane 11 by means of a layer 12, of thermal glue or of brazing alloy of AuSn type for example. Constituent active or passive elements of the component 10 can be bonded or brazed. In the present example of production, the microwave component comprises a single chip 2.

One or more layers 3, 14, 15, 16 are stacked on the rigid layer 13 to form a cavity intended to be filled with the LCP thermoplastic material 1 encapsulating the chip 2. The surface area occupied by the cavity contains the circuit(s)/element(s) that make up the electronic function of the component, these circuits and/or elements being intended to be encapsulated by the LCP material when the cavity is filled.

Among these stacked layers, there are bonding layers of thermoplastic material, notably the layers 14, 15 and 16, and functional layers, for example the interconnection layer 3. Before the filling of the cavity, the interconnection layer 3, of TAB type, is in fact positioned. It is connected first to the connection points 202 of the chip 2, the chip being fixed onto the support 11 once this connection operation is completed.

All of these layers, including the filled cavity, are covered with the outer layer consisting of a thermoplastic layer 17 covered with a conductive layer 18, of copper for example.

It is if necessary possible to produce vertical interconnections in this stacking by laser or mechanical drilling, and by chemical or electrolytic metallization, at different steps of the stacking process.

In a second phase 42, the pressing at the melting point of the LCP material is performed in order to bond all the layers together and fill all the interstices and flatness defects of the stacking. Advantageously, the rigid layer 13 forms a mechanical stop during the pressing which protects the chip, preserving its integrity.

In a third phase, the production of the component is finalised. In particular, through-holes 9 are drilled to create the Faraday cage protecting the internal circuit or circuits from interferences. If the component is not subject to such interferences, provision can be made to not produce the network of holes 9, that is to say to not produce a Faraday cage. The balling of the packages is also performed according to a standard method, of the brazing paste screen printing type, positioning of the balls 4 and remelting in an oven. The connections of the balls 4 with the internal circuits, and notably with the interconnection layer 3, can be produced by conductive tracks obtained by screen prints on the intermediate layers or on the top layer 17 and by a network of vias passing through these layers towards the balls. The balls 4 can also be linked electrically to a ground potential.

A microwave component 10 as described previously can be fabricated in series. To this end, stackings of layers of given length are provided forming a row of patterns, each pattern corresponding to a component. The strip of patterns obtained is then cut to obtain the individual components.

FIG. 4 illustrates the principle of production of a component according to the invention. The solution according to the invention is based on the implementation of a surface organic packaging technology, of BGA type, without cavity produced by a fabrication method.

The elimination of the cavity, originally defined for the placement of the chip or semiconductor 2 or passive elements, advantageously makes it possible to avoid the ingress of moisture in the form of liquid or vapour at the level thereof, and therefore to eliminate any problem of corrosion by electrochemical effect, in the metallic stackings of the electronic chips in the presence of a water electrolyte. The use of the LCP thermoplastic material makes it possible to obtain a package that is much more moisture resistant compared to all polymers used in the prior art.

The elimination of the internal cavity from the package makes it possible to make it significantly more compact, by notably eliminating the cavity walls defining the layout area for the electronic functions. A very compact component 10 can thus be obtained.

The structure of printed circuit type allows for the production of a structure of "Faraday cage" type, either by the production of metallized drill-holes 9, or by the production of bump contacts or metallized trenches connecting two metallic planes 11, 18 positioned one below and the other above the electronic function 2. This function is thus electrically insulated, which eliminates the problems of crosstalk between the component and other possible components.

The technique of printed circuit type also makes it possible to stack the electronic functions in the thickness of the package-forming structure.

Finally, the technique of printed circuit type makes it possible to achieve maximum integration densities, making it possible to stack functional layers and non-functional layer one on top of the other. The stacking of at least one rigid thermosetting layer 13 guarantees the mechanical strength of all of the structure forming the component.

The surface interconnection mode, of BGA type, makes it possible to design inputs and outputs of the component such that the latter can convey high-frequency signals shielded and insensitive to outside disturbances, particularly by virtue of the quasi-coaxial structure with a peripheral shielding 9, formed by ground connections.

The intermediate layers 14, 15, 16 are different from the first layer 13 and the top layer 17. The function of these layers 14, 15, 16 is notably to participate in the bonding of the multilayer structure that is thus produced.

The creep of the LCP, primarily in layers 14 and 16, during the pressing of the "sandwich", has to make it possible to obtain this result. The layer 15 consisting of an LCP or similar "laminate" which will not melt upon pressing, contrary to the layers 14 and 16 which have a lower melting point.

For this, the routing of signals is done only after pressing, either by laser vias 19 or metallized holes 9. In this approach, the dimensional modifications (variations of thicknesses) do not modify the connections since they are created after the fact, and their design can be adjusted to these variations.

The top layer 17, possibly consisting of a material similar to that of the layer 13, has to make it possible to maintain the flatness of the package.

The invention has been described for the production of a microwave component, but it can be applied more generally for an electronic component comprising one or more semi-conductor electronic circuits, accompanied for example by passive circuits. The electronic function made up of these elements is then encapsulated in a packaging as described previously.

The invention claimed is:

1. A method for packaging at least one electronic circuit, said method comprising at least:
    carrying out a first phase in which said electronic circuit is fixed onto a support and a number of layers of organic materials, interleaved with layers of LCP thermoplastic material, are stacked on said support to form a cavity in which said electronic circuit is enclosed, said cavity being filled by creep of an LCP thermoplastic material; and
    carrying out a second phase in which said layers are pressed onto said support at the melting point of the LCP material to bond all the layers together, a function of the stacked layers being to participate in the bonding of all the layers.

2. The packaging method according to claim 1, wherein an interconnection layer of TAB type is stacked with said layers, said interconnection layer being connected beforehand to the electronic circuit.

3. The packaging method according to claim 1, wherein the top layer covering the cavity is covered with a metallic layer.

4. The packaging method according to claim 3, further comprising:
    carrying out a third phase, wherein, said support being metallic, an array of metallized holes is produced on the periphery of the stacking of said layers, said holes electrically linking said support and said metallic layer so as to form a Faraday cage.

5. The packaging method according to claim 4, wherein, in the third phase, an array of balls is fixed onto said conductive layer, balls being linked electrically to said electronic circuit.

6. The packaging method according to claim 1, wherein said electronic circuit is a microwave circuit.

7. The packaging method according to claim 1, further comprising:
    forming an electronic component, said electronic component comprising:
        said support; and
        said layers of organic materials stacked on said support according to a technique of printed circuit type and forming a pre-existing cavity in which said electronic circuit is enclosed, said electronic circuit being placed in said pre-existing cavity delimited laterally by at least one rigid layer, said cavity being filled with a material of low permeability to water vapour.

8. The packaging method according to claim 7, wherein said material of low permeability to water vapour is of LCP type.

9. The packaging method according to claim 7, wherein the support, being metallic and the top organic layer of the stack being covered with a metallic layer, a network of metallic elements each linked to said support and to said metallic layer is arranged at the periphery of said component so as to form a Faraday cage including said electronic circuit.

10. The packaging method according to claim 9, wherein said metallic elements are metallized holes.

11. The packaging method according to claim 7, wherein the electronic component further comprises a flexible layer of interconnections of TAB type, stacked with said layers of organic materials, said layer of interconnections linking the connection points of said electronic circuit to interconnection points.

12. The packaging method according to claim 9, wherein, said component being of BGA type, an array of balls is arranged on said metallic layer.

13. The packaging method according to claim 7, wherein the electronic component further comprises at least one layer of LCP thermoplastic material.

14. The packaging method according to claim 7, wherein the support forms a heat sink.

15. The packaging method according to claim 7, wherein the electronic component further comprises at least one rigid layer.

16. The packaging method according to claim 7, wherein said electronic circuit is a microwave circuit of MMIC type.

* * * * *